United States Patent
Murata et al.

(10) Patent No.: US 7,800,116 B2
(45) Date of Patent: Sep. 21, 2010

(54) GROUP III-NITRIDE SEMICONDUCTOR DEVICE WITH A CAP LAYER

(75) Inventors: Tomohiro Murata, Osaka (JP); Masayuki Kuroda, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/058,114

(22) Filed: Mar. 28, 2008

(65) Prior Publication Data

US 2008/0237605 A1    Oct. 2, 2008

(30) Foreign Application Priority Data

Mar. 29, 2007   (JP) .............................. 2007-087370

(51) Int. Cl.
    *H01L 31/0256* (2006.01)
(52) U.S. Cl. .................. 257/76; 257/79; 257/E29.246; 257/E21.103; 257/E21.113; 257/E21.108
(58) Field of Classification Search .................. 257/76, 257/79, E29.246, E21.403, E21.113, E21.108; 438/285, 479, 507
    See application file for complete search history.

(56) References Cited

U.S. PATENT DOCUMENTS

| | | | |
|---|---|---|---|
| 2002/0139995 A1 | 10/2002 | Inoue et al. | |
| 2007/0295990 A1* | 12/2007 | Higashiwaki | 257/192 |
| 2008/0258243 A1* | 10/2008 | Kuroda et al. | 257/410 |

FOREIGN PATENT DOCUMENTS

| | | |
|---|---|---|
| JP | 10-223901 | 8/1998 |
| JP | 10-223907 | 8/1998 |
| JP | 2002-289837 | 10/2002 |
| JP | 2005-243802 | 9/2005 |
| JP | 2006-210472 | 8/2006 |

OTHER PUBLICATIONS

Murata et al. (Source Resistance Reduction of AlGaN-GaN HFETs with Novel Superlattice Cap Layer, IEEE Transactions on Electron Devices, vol. 52, pp. 1042-1047, 2005).*
Higashiwaki et al.( "AlGaN/GaN Heterostructure Field-Effect Transistors with Current Gain Cut-off Frequency of 152 GHz on Sapphire Substrates" Jpn. J. Appl. Phys. 44 (2005) pp. L475-L478).*

(Continued)

*Primary Examiner*—Bradley K Smith
*Assistant Examiner*—Jami M Valentine
(74) *Attorney, Agent, or Firm*—McDermott Will & Emery LLP

(57) ABSTRACT

A semiconductor device includes: a first semiconductor layer which is made of a first group III nitride semiconductor; a cap layer which is formed on the first semiconductor layer, which is made of a second group III nitride semiconductor, and which has an opening for exposing the first semiconductor layer; and a source electrode and a drain electrode which are formed on the cap layer so as to oppose to each other with the opening interposed. A gate electrode is formed on the bottom face of the opening with an insulating film interposed. The insulating film is formed on at least a part of the first semiconductor layer which is exposed through the opening.

25 Claims, 12 Drawing Sheets

OTHER PUBLICATIONS

Higashiwaki et al., "AlGaN/GaN MIS-HFETs With $f_T$ of 163 GHz Using Cat-CVD SiN Gate-Insulating and Passivation Layers", IEEE Electron Device Letters, vol. 27, No. 1, Jan. 2006, pp. 16-18.

Murata et al., "Source Resistance Reduction of AlGaN-GaN HFETs with Novel Superlattice Cap Layer", IEEE Transaction on Electron Devices, vol. 52, pp. 1042-1047, 2005.

* cited by examiner

GROUP III-NITRIDE SEMICONDUCTOR DEVICE WITH A CAP LAYER

CROSS REFERENCE TO RELATED APPLICATIONS

This non-provisional application claims priority under 35 U.S.C. §119(a) on Patent Application No. 2007-087370 filed in Japan on Mar. 29, 2007, the entire contents of which are hereby incorporated by reference.

BACKGROUND OF THE INVENTION

The present invention relates to a semiconductor device made of a group III nitride semiconductor and a method for manufacturing it, and particularly relates to a semiconductor device including a MIS (metal insulator semiconductor) type gate electrode and a method for manufacturing it.

Group III nitride semiconductors, which are typified by nitride gallium (GaN), as a mixed crystal expressed by a general formula of $(In_xAl_{1-x})_yGa_{1-y}N$ (wherein x and y are in the ranges of $0 \leq x \leq 1$, $0 \leq y \leq 1$, and $0 \leq x+y \leq 1$), are expected to be applied not only to visible or ultraviolet light emitting elements utilizing a physical characteristic of wide bandgap and a direct transition band structure but also to electronic devices utilizing characteristics of a large breakdown field and high saturation electron velocity.

Particularly, a heterojunction field effect transistor (hereinafter abbreviated it as HFET) utilizing two dimensional electron gas (hereinafter abbreviated it as 2DEG) appearing at the interface between epitaxially grown $Al_xGa_{1-x}N$ and GaN can have a high breakdown voltage with a large bandgap of GaN and also a large current with large sheet carrier density and large carrier mobility and is therefore expected as high-power high-frequency device, for which active research and development are being promoted.

For example, as shown in FIG. 18, a GaN layer 3 is formed on a sapphire substrate 1 with an AlN buffer layer 2 interposed and an AlGaN barrier layer 5 with a thickness of 8 nm is formed on the GaN layer 3 with a spacer layer 4 with a thickness of 1.3 nm interposed. A source electrode 6 and a drain electrode 7 are formed with a space left therebetween on the barrier layer 5, and a gate electrode 9 is formed in the region between the source electrode 6 and the drain electrode 7 on the barrier layer 5 with a silicon nitride (SiN) insulating film 8 interposed.

It was reported that the MIS type HFET including an AlGaN/GaN heterojunction according to the conventional example attains a maximum oscillation frequency $f_{max}$ of 192 GHz by thinning the barrier layer 5 to 8 nm and increasing the composition ratio of Al to 40% (see, for example, M. Higashiwaki, T. Matsui, and T. Mimura, "AlGaN/GaN MIS-FETs with $f_T$ of 163 GHz Using Cat-CVD SiN Gate-Insulating and passivation Layers," IEEE Electron Dev. Lett. Vol. 27 (2006), pp. 16-18, hereinafter referred to it as Non-patent Document 1).

In the above conventional semiconductor device, while high transconductance ($g_m$) is attained by thinning the AlGaN barrier layer 5 to 8 μm, the electron density is increased by forming the silicon nitride insulating film 8 in the region between the source electrode 6 and the drain electrode 7 on the barrier layer 5 for modulating the potential in the vicinity of the 2DEG channel. This reduces the source resistance to attain higher high frequency characteristics.

The above conventional semiconductor device composed of a MIS type HFET, however, involves the following problems.

As described above, enhancement of the transconductance and reduction of the source resistance must be achieved for attaining high frequency characteristics. When the barrier layer 5 is thinned for increasing the transconductance, however, the electron density in the channel from the gate electrode 9 to the source electrode 6 reduces to increase the parasitic resistance including the source resistance. Even though the source resistance can be reduced by shortening the distance between the source electrode 6 and the gate electrode 9, the process technology for forming electrodes limits such shortening of the distance therebetween.

This means that the source resistance is reduced insufficiently in the conventional semiconductor device.

Further, in order to implement enhancement of the transconductance, the inventors have conducted various examinations into structures in which a cap layer for reducing the source resistance is provided between the source resistance and the barrier layer. The barrier layer is desired to be thin as far as possible for enhancing the transconductance of a transistor. Accordingly, the cap layer formed on the barrier layer may have a structure in which an opening is formed for exposing the barrier layer and a part of the barrier layer which is exposed through the opening, that is, a part of the barrier layer which remains after recess etching is thinned.

However, the inventors have found that thinning the part of the barrier layer which is exposed through the opening reduces especially the electron density in the channel region present below the region from the end on the source electrode side to the gate electrode of the opening and the electron density in the channel region present below the region from the end on the drain electrode side to the gate electrode thereof.

SUMMARY OF THE INVENTION

The present invention has its object of reducing the source resistance while enhancing the transconductance of a transistor made of a group III nitride semiconductor by solving the conventional problems and the newly-found problems.

In order to attain the above abject, the present invention provides a semiconductor device which includes a cap layer with low resistance formed between at least a source electrode and a barrier layer and an insulating film formed on a part in a gate electrode formation region of the barrier layer which is exposed through the cap layer.

Specifically, a semiconductor device in accordance with the present invention includes: a first semiconductor layer made of a first group III nitride semiconductor; a cap layer which is formed on the first semiconductor layer, which is made of a second group III nitride semiconductor, and which has an opening for exposing the first semiconductor layer; a source electrode and a drain electrode which are formed on the cap layer so as to oppose to each other with the opening interposed; an insulating film formed on at lest a part of the first semiconductor layer which is exposed through the opening; and a gate electrode formed on a bottom face of the opening with the insulating film interposed.

In the semiconductor device in accordance with the present invention, the use of a semiconductor material with low resistance for the cap layer is equivalent to formation of the source electrode and the gate electrode close to each other, thereby reducing the source resistance. Additionally, the insulating film is provide on the part in the gate electrode formation region of the barrier layer which is exposed through the opening of the cap layer to thus increase the electron density in the channel region present below the region from the end on the source electrode side to the gate electrode of the opening and the electron density in the channel region present below the region from the end on the drain electrode side to the gate electrode thereof. This enhances the transconductance of the semiconductor device.

In the semiconductor device of the present invention, the insulating film is preferably formed also on a wall face of the cap layer which is exposed through the opening.

In the semiconductor device of the present invention, it is preferable that the cap layer has a layered structure formed by layering a third semiconductor layer made of a third group III nitride semiconductor and a fourth semiconductor layer made of a fourth group III nitride semiconductor having a bandgap wider than that of the third group III nitride semiconductor.

In this case, it is preferable that the third semiconductor layer is made of gallium nitride while the fourth semiconductor layer is made of aluminum gallium nitride.

With the above arrangement, the effect by multiple two-dimensional electron gas generated in the layered structure of, for example, AlGaN and GaN results in reduction in resistance in the direction along the principal plane of the first semiconductor layer, as disclosed in T. Murata, M. Hikita, Y. Hirose, Y. Uemoto, K. Inoue, T. Tanaka, and D. Ueda, "Source Resistance Reduction of AlGaN—GaN HFETs with Novel Superlattice Cap layer," IEEE Trans. Electron Devices, Vol. 52, pp. 1042-1047, 2005 (hereinafter referred to it as Non-patent Document 2). At the same time, the effect by high-density electrons accumulated inside the layered structure results in reduction in potential barrier generated due to the presence of negative polarized charges generated at the interface between the first semiconductor layer and the cap layer. In association, the resistance in the direction perpendicular to the principal plane of the first semiconductor layer reduces to reduce the source resistance.

In the semiconductor device of the present invention, the cap layer may include a semiconductor layer made of indium aluminum gallium nitride (InAlGaN).

With the above arrangement, as disclosed in Japanese Unexamined Patent Application Publication 2002-289837 (hereinafter referred to it as Patent Document 1), appropriate adjustment of each composition of the four-element mixed crystal of InAlGaN allows the lattice constant of the InAlGaN to mach the lattice constant of GaN. At the same time, the degree of polarization generated in InAlGaN is allowed to be equal to or larger than the degree of the polarized charges generated at the surface of the first semiconductor layer. As a result, no potential barrier against the electrons is generated between the source electrode and the first semiconductor layer to thus reduce the source resistance.

In the semiconductor device of the present invention, the first semiconductor layer preferably includes an $Al_xGa_{1-x}N$ layer and a GaN layer in contact with the $Al_xGa_{1-x}N$ layer, wherein $0<x\leqq1$.

With the above arrangement, a high-density 2DEG generated at the interface between the $Al_xGa_{1-x}N$ layer and the GaN layer can be used as a channel to reduce the source resistance.

In the semiconductor device of the present invention, the insulating film may be made of silicon nitride.

With the above arrangement, the potential of the 2DEG channel is modulated to increase the electron density, thereby reducing the source resistance.

In the semiconductor device of the present invention, the insulating film may be made of crystallized silicon nitride.

With the above arrangement, a thin but dense gate insulating film is formed as an insulating film, so that a transistor with large transconductance ($g_m$) can be realized while the gate insulating property is secured.

In the semiconductor device of the present invention, the gate electrode preferably includes an upper part and a lower part which is in contact with the insulating film and which is formed thinner than the upper part.

With the above arrangement, the sectional area of the gate electrode is increased while the gate length as a dimension of the lower part of the gate electrode which is in contact with the insulating film is shortened. This prevents the gate resistance from increasing to thus improve the high frequency characteristics.

In the semiconductor device of the present invention, the insulating film is preferably a layered film of two or more layers.

This arrangement achieves enhancement of the insulating property of the insulating film (gate insulating film). In general, a gate insulating film is so thin, about several nanometers, to invite formation of a pin hole therein. In a case using metal capable of ohmic contact with GaN, such as titanium (Ti) as a material of the gate electrode formed on the insulating film, the leakage current flows through the pin hole to lower the insulating property. For tackling this problem, the second insulating layer is formed on the first insulating layer to reinforce the insulating film as a whole, thereby preventing the insulating property of the insulating film from lowering.

In this case, the layered film may include a lower layer film and an upper layer film having a dielectric constant lower than that of the lower layer film.

In this case, the lower layer film is preferably made of silicon nitride (SiN) while the upper layer film is made of silicon oxide ($SiO_2$).

This arrangement attains the following two effects. First, the insulating property of the insulating film (gate insulating film) is enhanced, as described above. Second, the parasitic gate capacity can be reduced. Silicon nitride, which has a comparatively high dielectric constant k of 7 to 8, increases the gate capacity though effects can be expected that the electron density of the 2DEG as a channel can be increased by modulating the potential of the surface of the first semiconductor layer (barrier layer) and that current collapse can be suppressed. In view of this, silicon oxide having a dielectric constant (k=4) smaller than that of the silicon nitride is deposited as an upper layer of the silicon nitride, so that the gate capacity reduces when compared with the case where the silicon nitride is made thick to have the same thickness as the total thickness of the two insulating films in the present invention.

In this case, it is preferable that a region of the layered film which is in contact with a lower part of the gate electrode or a part of the region is caved to an extent that the first semiconductor layer is not exposed.

With the above arrangement, the gate length is determined according to the width of the concave part caved under the gate electrode rather than the dimension of the gate electrode itself. This achieves shortening of the effective gate length without necessitating minimization of the gate electrode itself of which miniaturization is difficult.

In the semiconductor device of the present invention, it is preferable that a recessed part reaching the first semiconductor layer is formed in a region of the cap layer which is located outside the opening.

When the source electrode and the drain electrode as ohmic electrodes are made in direct contact with both the top of the cap layer and the first semiconductor layer as the channel, as in the above arrangement, the contact resistance reduces, thereby further reducing the source resistance.

In the semiconductor device of the present invention, it is preferable that a distance from a drain electrode side end of the opening to the gate electrode is larger than a distance from a source electrode side end of the opening to the gate electrode.

With the above arrangement, the breakdown voltage between the gate electrode and the drain electrode increases in addition to achievement of an effect that the source resistance is reduced by making the cap layer to be close to the gate electrode, thereby attaining further high output operation.

In the semiconductor device of the present invention, a distance from a wall face of the opening to a side face of a lower end part of the gate electrode is preferably 100 nm or less.

A method for manufacturing a semiconductor device in accordance with the present invention includes the steps of: forming on a substrate a first semiconductor layer made of a group III nitride semiconductor; forming on the first semiconductor layer a cap layer made of a second group III nitride semiconductor; forming an etching mask layer on the cap layer and forming a first opening in the thus formed etching mask layer for exposing the cap layer; forming a second opening having an opening width larger than that of the first opening and exposing the first semiconductor layer by etching the cap layer with the use of the etching mask layer in which the first opening is formed as a mask; forming through the first opening an insulating film on at least a part of the first semiconductor layer which is exposed through the second opening; and forming a gate electrode on the insulating film formed on a bottom face of the second opening through the first opening, wherein a distance from a wall face of the second opening to a side face of a lower end part of the gate electrode is 100 nm or less.

According to the semiconductor device manufacturing method of the present invention, the second opening as a gate recess and the gate electrode are formed in self alignment. Specifically, the gate electrode and the cap layer can be made close to each other free from the constraint of the mask alignment precision defined by lithography, with a result that the parasitic resistance between the gate electrode and the ohmic electrodes can be reduced to utmost.

In the semiconductor device manufacturing method of the present invention, it is preferable that the cap layer has a layered structure obtained by layering a third semiconductor layer made of a third group III nitride semiconductor and a fourth semiconductor layer made of a fourth group III nitride semiconductor having a bandgap wider than that of the third group III nitride semiconductor.

As described above, the semiconductor device and the semiconductor device manufacturing method in accordance with the present invention achieves enhancement of the transconductance of a transistor made of a group III nitride semiconductor and reduction of the source resistance, thereby attaining transistor operation in a further higher high frequency band.

BEST MODE FOR CARRYING OUT THE INVENTION

Embodiment 1

Embodiment 1 of the present invention will now be described with reference to the accompanying drawings.

Figure 1:
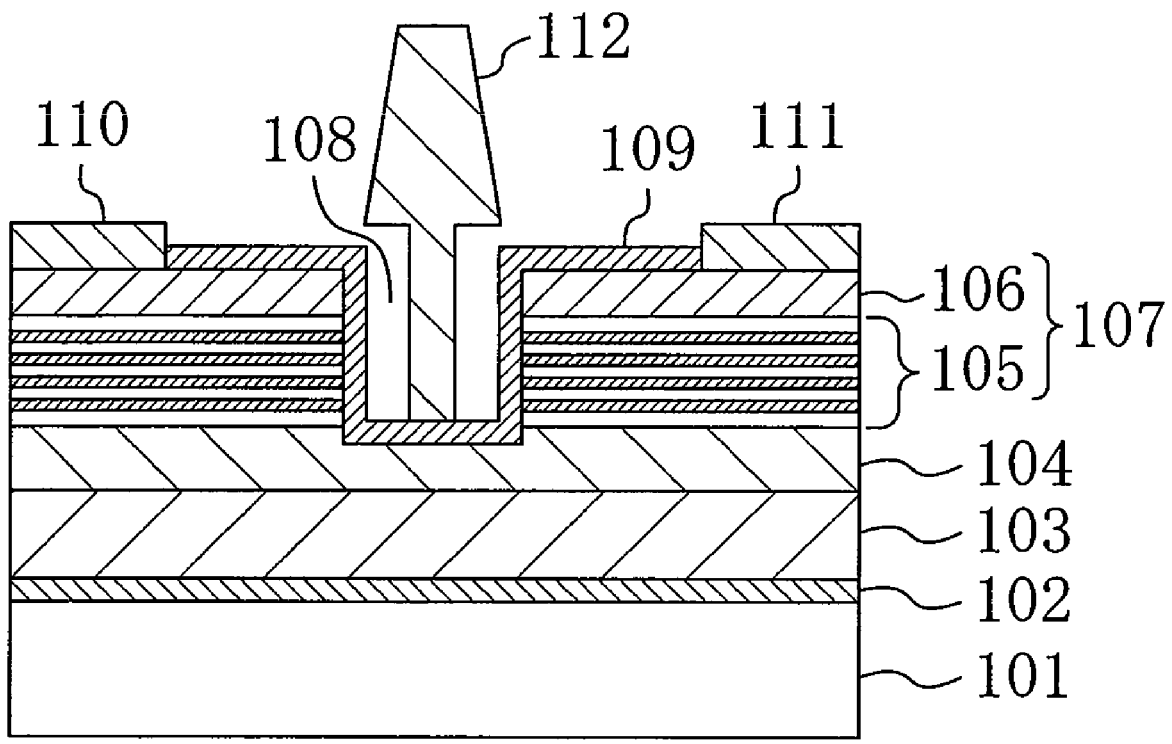
FIG. 1 is a sectional view showing a semiconductor device in accordance with Embodiment 1 of the present invention.

FIG. 1 shows a sectional structure of a MIS type HFET as a semiconductor device in accordance with Embodiment 1 of the present invention.

As shown in FIG. 1, a buffer layer 102, an active layer 103, a barrier layer 104, a superlattice layer 105, and an n-type GaN layer 106 are formed in this order on the principal face of a substrate 101 made of sapphire (single crystal of $Al_2O_3$) by epitaxial growth. The buffer layer 102 is made of aluminum nitride (AlN) or gallium nitride (GaN) grown at low temperature. The active layer 103 is made of GaN. The barrier layer 104 is made of aluminum gallium nitride ($Al_{0.26}Ga_{0.74}N$). The superlattice layer 105 is formed by layering an n-type $Al_{0.26}Ga_{0.74}N$ layer with a thickness of 5.6 nm and an n-type GaN layer with a thickness of 1.4 nm seven times. The n-type GaN layer 106 has a thickness of 20 nm. A combination of the superlattice layer 105 and the n-type GaN layer 106 forms a cap layer 107. In order to increase the electron mobility of a 2DEG channel, a spacer layer made of AlN with a thickness of approximately 1 nm may be formed between the active layer 103 and the barrier layer 104.

In the cap layer 107, a gate recess 108 for exposing the barrier layer 104 is formed selectively as a gate electrode formation region. An insulting film 109 made of silicon nitride with a thickness of approximately 4 nm is formed on the bottom and wall faces of the gate recess 108 and on a part of the upper face of the cap layer 107. The thickness of the insulating film 109 as a gate insulating film is extremely small on the barrier layer 104 for preventing performance lowering. When the thickness thereof exceeds about 100 nm, performance lowering occurs, for example, the transconductance ($g_m$) lowers, the threshold voltage of the transistor becomes deep, namely, the negative absolute value of the threshold voltage becomes large, and the like. While on the other hand, when the thickness thereof is below 1 nm, problems in the uniformity of the film thickness is involved, for example, a pin hole and the like is liable to be formed in the insulating film 109. Accordingly, the thickness of the insulating film 109 is preferably in the range between 1 nm and 100 μm, both inclusive. More preferably, it is in the range between 1 μm and 10 nm, both inclusive. The insulating film 109 functions as a passivation film on the wall faces of the gate recess 108 and on the cap layer 107.

On the part of the cap layer 107 which is exposed from the insulating film 109, a source electrode 110 and a drain electrode 111, which are formed of a layered film of titanium (Ti) and aluminum (Al), are formed so as to oppose to each other with the gate recess 108 interposed.

A gate electrode 112 made of titanium (Ti) and aluminum (Al) is formed on the insulating film 109 at the bottom of the gate recess 108. The gate electrode 112 is a generally-called T-shaped gate electrode in a sectional structure that the lower part thereof, which is housed in the gate recess 108, is formed thin so as to be spaced apart from the wall faces of the gate recess 108 while the upper part thereof, which is located outside the gate recess 108, is larger than the lower part. This structure shortens the gate length to reduce the gate capacity. In addition, the enlarged upper part of the gate electrode 112 reduces the gate resistance. As a result, the maximum oscillation frequency $f_{max}$ of the semiconductor device increases favorably.

Figure 2:
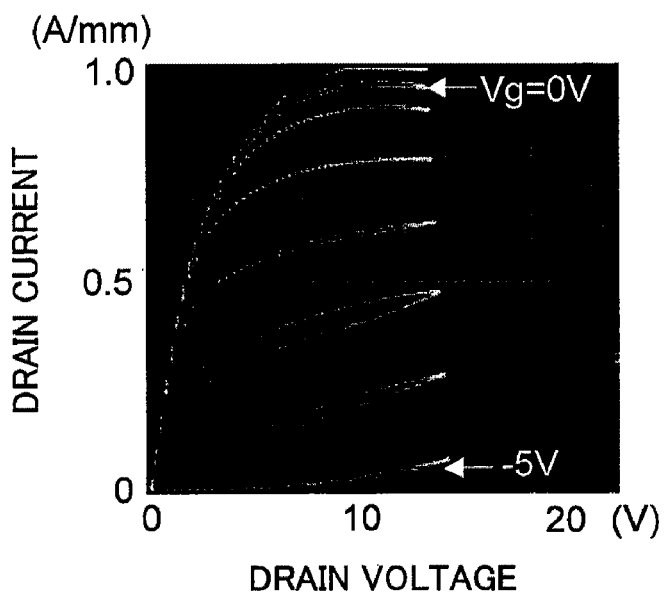
FIG. 2 is a graph showing a current-voltage (I-V) characteristic of the semiconductor device in accordance with Embodiment 1 of the present invention.
Figure 3:
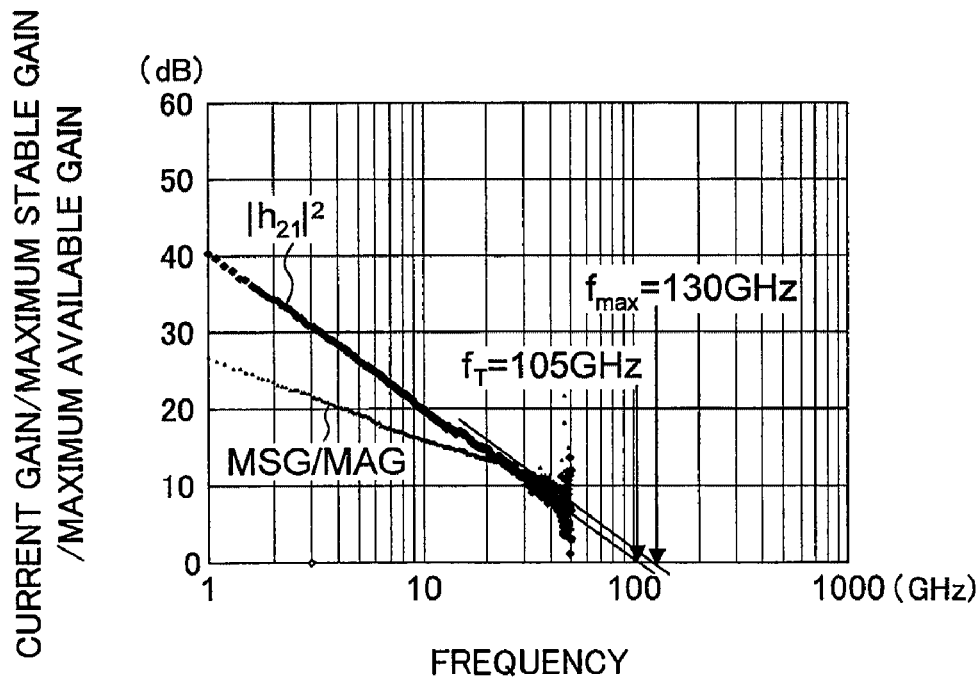
FIG. 3 is a graph showing a high frequency (RF) characteristic of the semiconductor device in accordance with Embodiment 1 of the present invention.

FIG. 2 shows a current-voltage (I-V) characteristic of the semiconductor device of Embodiment 1, and FIG. 3 shows frequency dependence on the current gain and the maximum stable gain/the maximum available gain of the semiconductor device of Embodiment 1. In FIG. 3, $|h_{21}|^2$ represents the current gain, MSG represents the maximum stable gain, and MAG represents the maximum available gain.

FIG. 2 proves that the semiconductor device of the present embodiment has an excellent I-V characteristic while FIG. 3 proves that the semiconductor device of the present embodiment has a maximum frequency of oscillation $f_{max}$ of 130 GHz and a current gain cutoff frequency $f_T$ of 105 GHz.

As described above, in Embodiment 1, the low-resistance cap layer 107 formed of the n-type GaN layer 106 and the superlattice layer 105 can be made close to the vicinity of the gate electrode 112 under the constraint of the lithography precision, and hence, the source resistance can be reduced.

In the present embodiment, the n-type GaN layer 106 and the superlattice layer 105 made of AlGaN/GaN form the cap layer 107. With this structure, the following effect of resistance lowing can be attained.

Namely, as disclosed in Non-patent Document 2, the cap layer 107 including the superlattice layer 105 lowers the resistance in the direction parallel to the principal plane of the substrate by the effect by the multiple two-dimensional electron gas generated inside the superlattice layer 105. At the same time, the resistance in the direction perpendicular to the principal plane of the substrate can be reduced as well because the potential barrier caused by the negative polarized charges generated at the interface between the barrier layer 104 and the cap layer 107 can be reduced by the effect by the high-density electrons accumulated inside the superlattice layer 105. As a result, the source resistance reduces.

A method for manufacturing the thus structured semiconductor device (MIS-type HFET) will be described below with reference to the drawings.

FIG. 4A to FIG. 4D are sectional views showing in sequence steps of the semiconductor device manufacturing method in accordance with Embodiment 1 of the present invention.

Figure 4A:
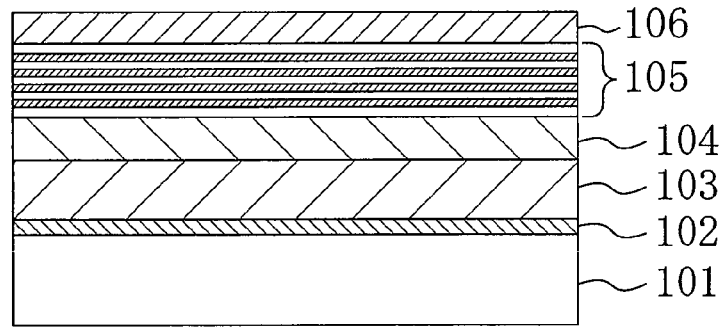
FIG. 4A to FIG. 4D are sectional views showing steps of a semiconductor device manufacturing method in accordance with Embodiment 1 of the present invention.

First, as shown in FIG. 4A, the buffer layer 102 made of AlN or GaN grown at low temperature, the active layer 103 made of GaN, the barrier layer 104 made of $Al_{0.26}Ga_{0.74}N$, the superlattice layer 105 formed by layering an n-type $Al_{0.26}Ga_{0.74}N$ layer and an n-type GaN layer seven times, and the n-type GaN layer 106 are formed in this order on the principal face of the substrate 101 made of sapphire by epitaxial growth by, for example, MOCVD (Metal Organic Chemical Vapor Deposition).

Figure 4B:
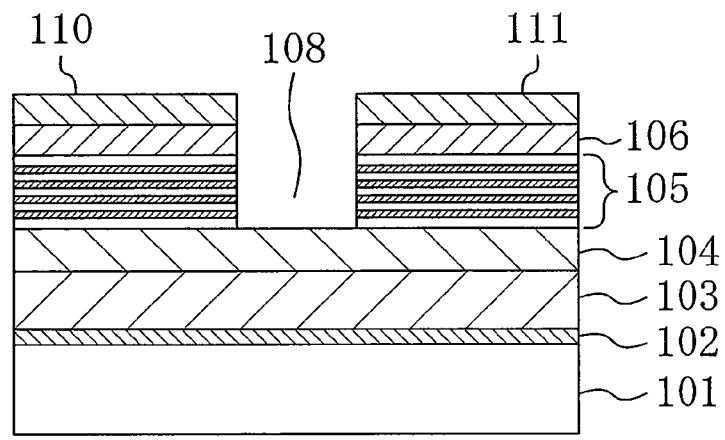

Next, as shown in FIG. 4B, lithography and dry etching using a chlorine ($Cl_2$) gas as a main component of the etching gas are performed for selectively caving respective parts of the n-type GaN layer 106, the superlattice layer 105, and the barrier layer 104 to form the gate recess 108, so that the gate electrode formation region of the barrier layer 104 is exposed. Then, though not shown, ion implantation or the like is performed on the outside parts of the source electrode formation region and the drain electrode formation region for isolation.

Figure 4C:
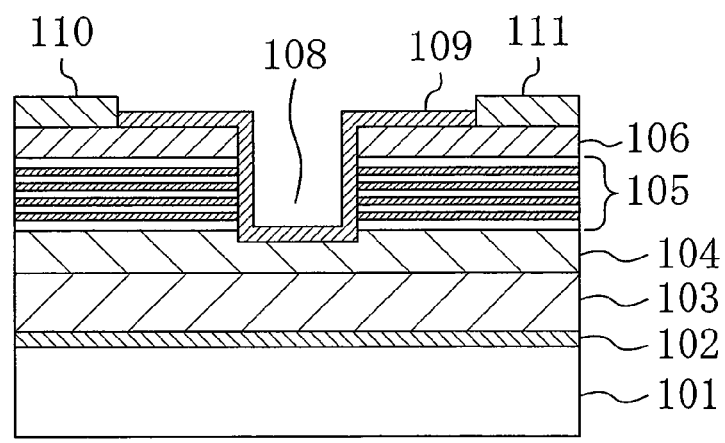

Subsequently, as shown in FIG. 4C, MOCVD or p-CVD (Plasma enhanced Chemical Vapor Deposition), for example, is performed to deposit the insulating film 109 made of silicon nitride with a thickness of, for example, approximately 4 nm on the entire surface of the n-type GaN layer 106 including the bottom and wall faces of the gate recess 108. Then, lithography and dry etching are performed to remove respective ohmic electrode formation regions of the source electrode and the drain electrode, which are regions of the insulating film 109 which are opposed to each other with the gate recess 108 interposed, for selectively exposing the n-type GaN layer 106. Vacuum deposition or the like is then performed with the use of a resist mask (not shown) exposing each ohmic electrode formation region to deposit Ti and Al. Generally-called lift-off is performed for removing the resist mask to thus form the source electrode 110 and the drain electrode 111 which are made of Ti and Al. Then, predetermined heat treatment is performed to alloy the source electrode 110, the drain electrode 111, and the n-type GaN layer 106 blow each electrode.

Figure 4D:
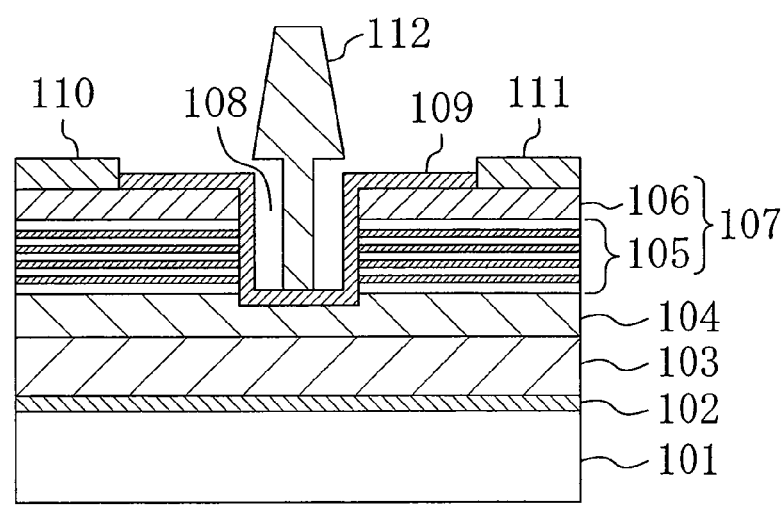

Thereafter, as shown in FIG. 4D, a mask pattern formed of plural layers in which a small opening and a large opening continuing thereabove are formed in a part corresponding to the gate recess 108 is formed, and then, deposition is performed to fill Ti and Al in the openings of the mask pattern. Lift-off is performed then for removing the mask pattern to thus form the T-shaped TiAl gate electrode 112 including the thin lower part and the thick upper part in section.

Figure 5:
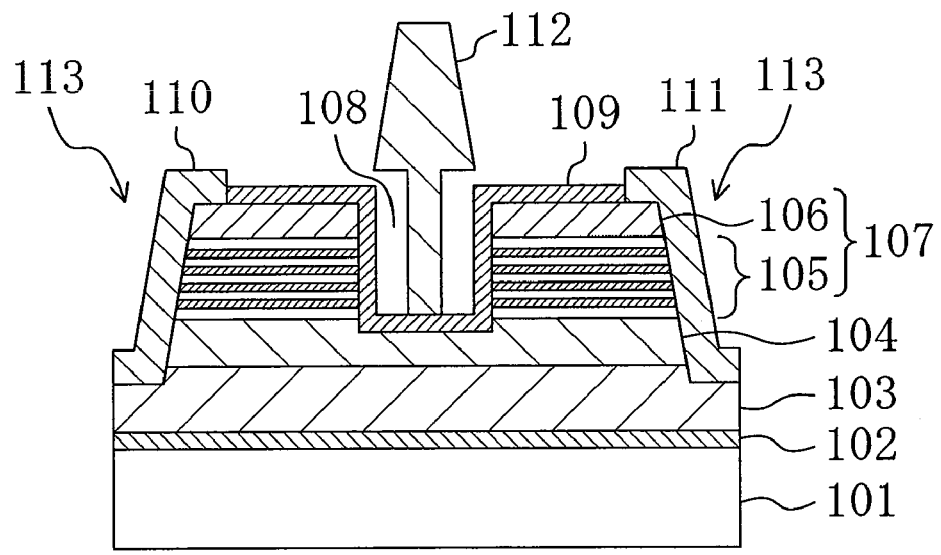
FIG. 5 is a sectional view showing a semiconductor device in accordance with one modified example of Embodiment 1 of the present invention.

As shown in FIG. 5 as one modified example of Embodiment 1, it is preferable to form as an isolation region an ohmic recess 113 extending from the n-type GaN layer 106 to the active layer 103 in a part of each ohmic electrode formation region in the step of forming the gate recess 108 in FIG. 4B.

In this arrangement of the semiconductor device of the present modified example, the ohmic electrodes are in contact with the top and side faces of the n-type GaN layer 106, the side face of the superlattice layer 105, and the side face of the 2DEG channel generated at the interface between the barrier layer 104 and the active layer 103, thereby reducing the contact resistance further. Moreover, the low-resistance cap layer 107 formed of the n-type GaN layer 106 and the superlattice layer 105 and a 2DEG channel layer to be formed in the active layer 103 are not present in the isolation region, thereby reducing the capacity of the interconnects to be connected to the semiconductor device.

Embodiment 2

Embodiment 2 of the present invention will be described below with reference to the drawings.

Figure 6:
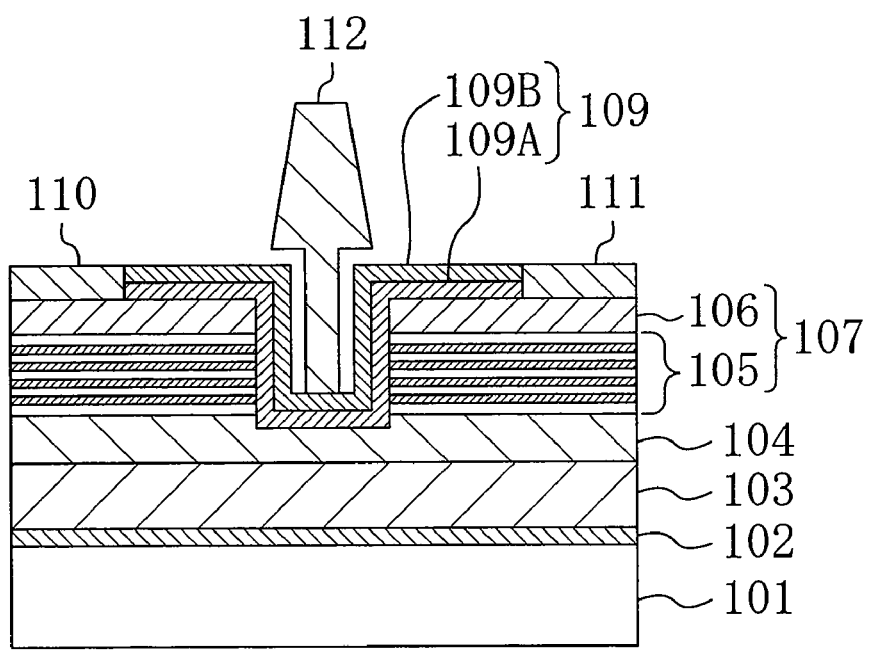
FIG. 6 is a sectional view showing a semiconductor device in accordance with Embodiment 2 of the present invention.

FIG. 6 shows a sectional structure of a MIS-type HFET as a semiconductor device according to Embodiment 2 of the present invention. In FIG. 6, the same reference numerals are assigned to the same elements as those shown in FIG. 1 for omitting description thereof.

As shown in FIG. 6, in the semiconductor device of Embodiment 2, the insulating film 109 formed between the gate electrode 112 and the barrier layer 104 is formed of a lower insulating film 109A formed by MOCVD, for example, and made of silicon nitride (SiN) with a thickness of approximately 3 nm and an upper insulating film 109B formed by p-CVD, for example, and made of silicon nitride (SiN) with a thickness of approximately 4 nm.

The two-layer structure of the insulating film 109 as a gate insulating film exhibits the following effect.

Namely, the insulating property of the insulating film 109 is enhanced. In general, a gate insulating film is extremely thin, approximately several nanometers to invite formation of a pin hole in the insulating film 109. When metal capable of being in ohmic contact with gallium nitride (GaN), such as titanium (Ti) or the like is used as a material of the gate electrode 112, the leakage current flows through the pin hole to lower the insulating property. For tackling this problem, the second upper insulating layer 109B is formed to reinforce the insulating film 109, thereby preventing the insulating property of the insulating film 109 from lowering.

The upper insulating film 109B shown in FIG. 6 may be formed by p-CVD, for example, and made of silicon oxide ($SiO_2$) with a thickness of 4 nm. With this arrangement, an effect of reducing the parasitic capacity as will be described below can be expected in addition to the effect of enhancing the insulating film as a whole.

Namely, the lower insulating film 109A made of silicon nitride is expected to exhibit an effect of increasing the density of the 2DEG to be a channel when modulating the potential of the surface of the barrier layer 104 made of AlGaN and an effect of suppressing current collapse. Silicon nitride, however, has a comparatively high dielectric constant k, approximately 7 to 8 to increase the gate capacity. To tackle this problem, silicon oxide having a dielectric constant k of approximately 4 is used as a material of the second upper insulating film 109B to thus reduce the parasitic gate capacities of the gate electrode 112 and the barrier layer 104. In view of this, an insulating film having a dielectric constant lower than that of the lower insulating film 109A is preferably used as the upper insulating film 109B.

Figure 7:
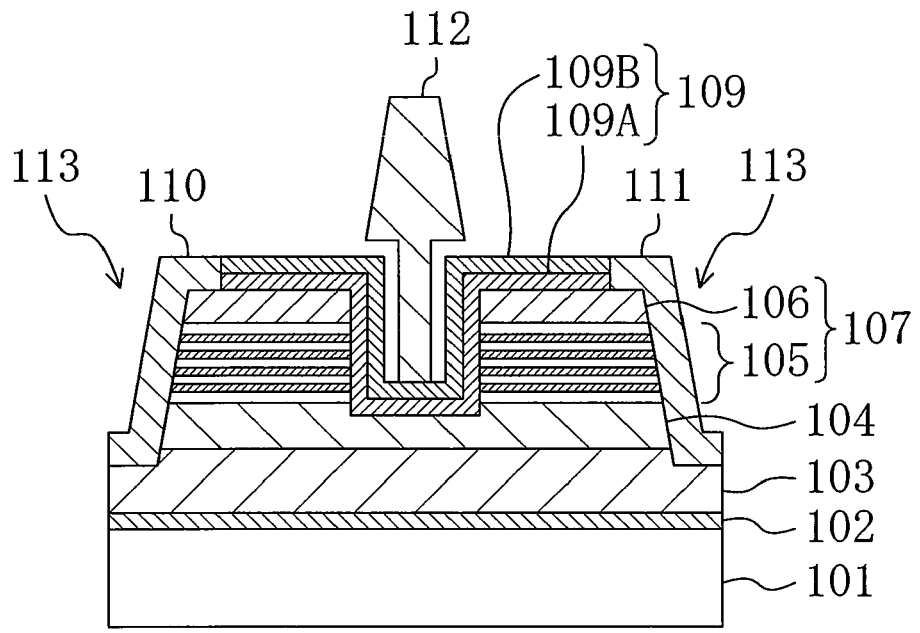
FIG. 7 is a sectional view showing a semiconductor device in accordance with one modified example of Embodiment 2 of the present invention.

Preferably, as shown in FIG. 7 as one modified example of Embodiment 2, the ohmic recess 113 extending from the n-type GaN layer 106 to the active layer 103 in a part of each ohmic electrode formation region is formed as an isolation region.

Embodiment 3

Embodiment 3 of the present invention will be described below with reference to the drawings.

Figure 8:
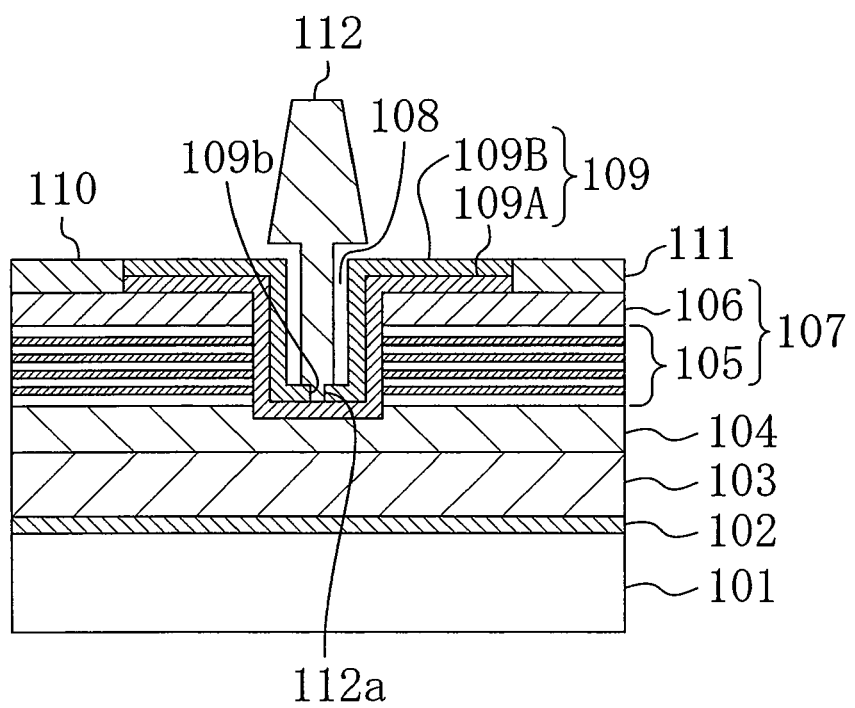
FIG. 8 is a sectional view showing a semiconductor device in accordance with Embodiment 3 of the present invention.

FIG. 8 shows a sectional structure of a MIS-type HFET as a semiconductor device in accordance with Embodiment 3 of the present invention. In FIG. 8, the same reference numerals are assigned to the same elements as those shown in FIG. 6 for omitting description thereof.

As shown in FIG. 8, in the semiconductor device of Embodiment 3, a concave part 109b for exposing the lower insulating film 109A is formed at the bottom of the gate recess 108 in the upper insulating film 109B forming the insulating film 109. A lower end portion 112a of the gate electrode 112 is filled in the concave part 109b formed in the upper insulating film 109B. Wherein, the opening width in the gate length direction of the concave part 109b is smaller than the width of a part of the gate electrode 112 which is located on the upper insulating film 109B.

With the above structure, a part of the insulating film 109 becomes thin which is located blow the lower end portion 112a in the concave part 109b effectively functioning as the gate electrode 112, and accordingly, the transconductance ($g_m$) is prevented from lowering.

Further, the gate electrode 112 is formed so as to fill the concave part 109b of the upper insulating film 109B to increase the contact area of the gate electrode 112 with the upper insulating film 109B, thereby increasing adhesiveness of the gate electrode 112 to the upper insulating film 109B. Moreover, the lower end portion 112a of the gate electrode 112 which is fitted in the concave part 109b functions as an effective gate electrode, thereby leading to shortening of the effective gate length.

In addition, since the upper insulating film 109B is smaller in dielectric constant than the lower insulating layer 109A, namely, the dielectric constant of silicon oxide composing the upper insulating film 109B is smaller than that of silicon nitride composing the lower insulating film 109A, the parasitic gate capacity caused at a part of the gate electrode 112 which is located outside the concave part 109b and covers the upper insulating film 109B can be suppressed low.

A method for forming the upper insulating film 109B and the concave part 109b therein will be described below with reference to the drawings. Herein, only differences from Embodiment 2 will be discussed.

Figure 9:
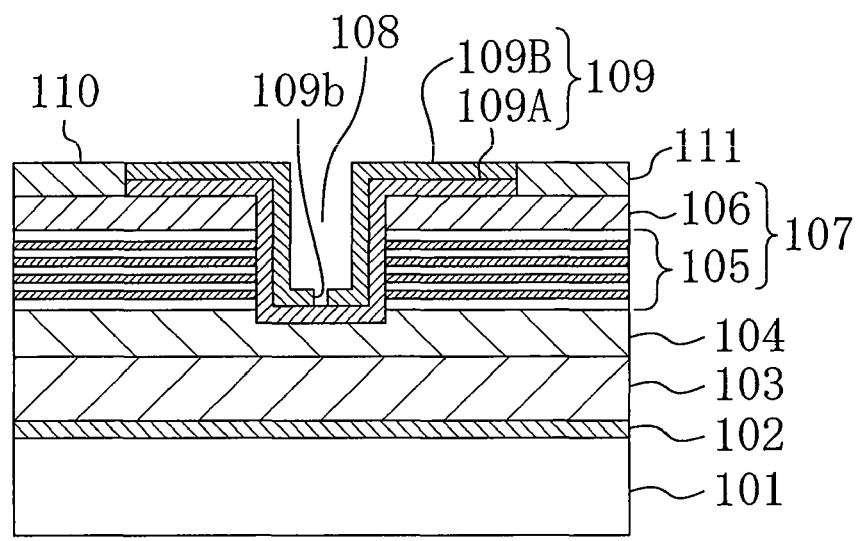
FIG. 9 is a sectional view showing a step of a semiconductor device manufacturing method in accordance with Embodiment 3 of the present invention.

As shown in FIG. 9, after the gate recess 108 for exposing the barrier layer 104 is formed in the cap layer 107, MOCVD is performed to deposit the lower insulating film 109A made of silicon nitride on the bottom and wall faces of the gate recess 108 and on the cap layer 107. Then, p-CVD is performed to deposit the upper insulating film 109B made of silicon oxide on the lower insulating film 109A. Dry etching using fluorocarbon as a main component of the etching gas is performed to form in the upper insulating film 109B the concave part 109b to which the lower end portion 112a of the gate electrode 112 is to be filled. Wherein, the bottom face of the concave part 109b is not necessarily leveled at the surface of the lower insulating film 109A and may reach the inside of the lower insulating film 109A as long as the barrier layer 104 is not exposed. Alternatively, the bottom face of the concave part 109b may be leveled within the upper insulating film 109B without reaching the surface of the lower insulating film 109A. The concave part 109b can be formed by wet etching using hydrofluoric acid (HF) or a mixed solution thereof rather than dry etching. The lower insulating film 109A made of silicon nitride and formed by MOCVD is less etched by wet etching, and therefore, only the upper insulating film 109B can be opened selectively by wet etching. Thereafter, the T-shaped gate electrode 112 including the thin lower part and the thick upper part is formed so that the concave part 109b in the gate recess 108 is filled with the lower end portion 112a of the gate electrode 112, thereby obtaining the semiconductor device shown in FIG. 8.

The lower insulating film 109A may be a SiN film formed by p-CVD rather than the SiN film formed by MOCVD.

Furthermore, the upper insulating film 109B may be a SiN film rather than the $SiO_2$ film.

Figure 10:
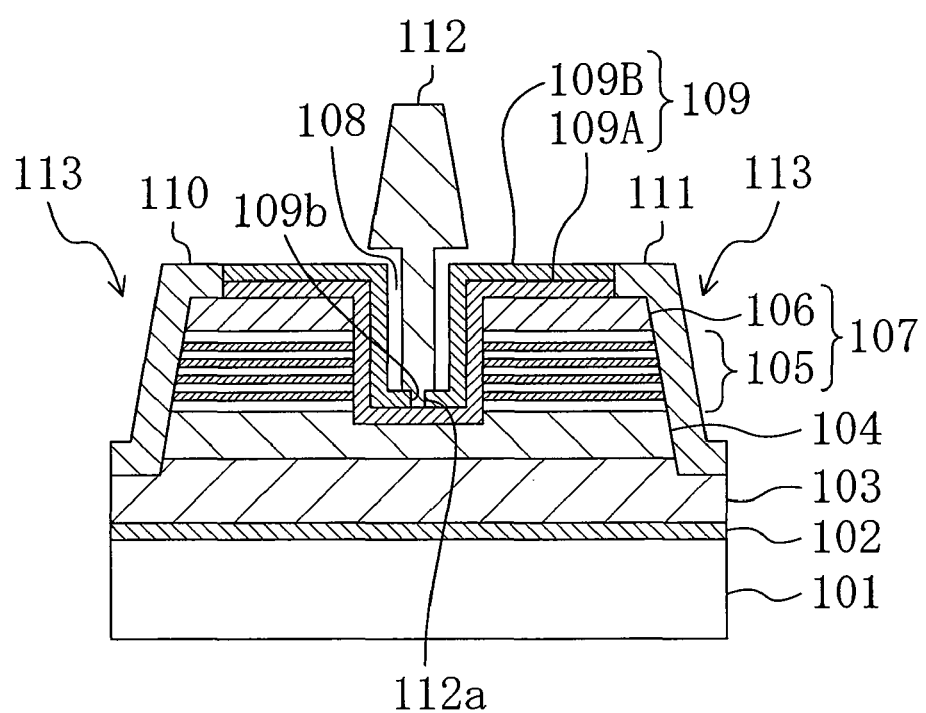
FIG. 10 is a sectional view showing a semiconductor device in accordance with one modified example of Embodiment 3 of the present invention.

Preferably, as shown in FIG. 10 as one modified example of Embodiment 3, the ohmic recess 113 extending from the n-type GaN layer 106 to the active layer 103 in a part of each ohmic electrode formation region is formed as an isolation region.

Embodiment 4

Embodiment 4 of the present invention will be described below with reference to the drawings.

Figure 11:
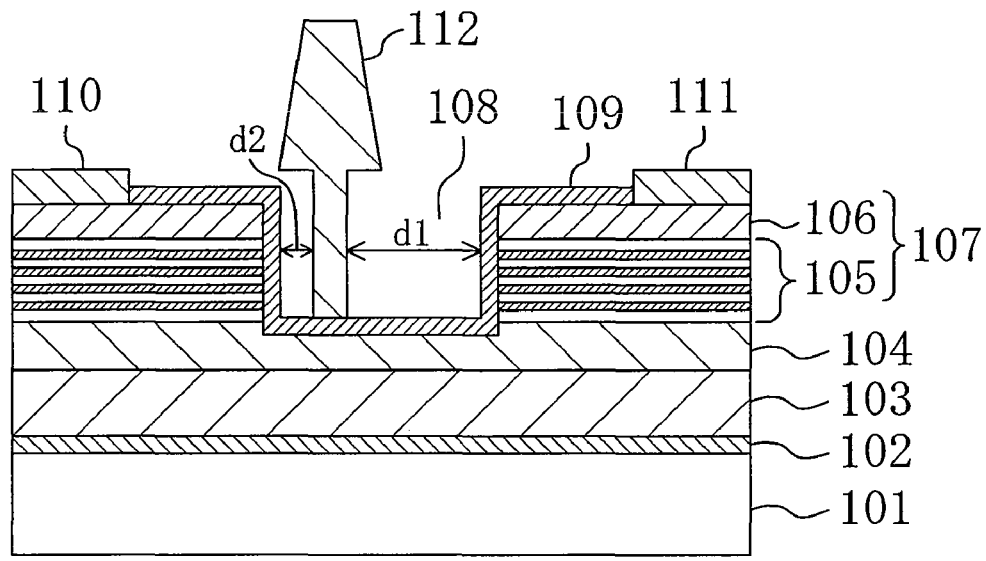
FIG. 11 is a sectional view showing a semiconductor device in accordance with Embodiment 4 of the present invention.

FIG. 11 shows a sectional structure of a MIS-type HFET as a semiconductor device in accordance with Embodiment 4 of the present invention. In FIG. 11, the same reference numerals are assigned to the same elements as those shown in FIG. 1 for omitting description thereof.

As shown in FIG. 11, in the semiconductor device of embodiment 4, the distance dl from the drain electrode 111 side end of the gate recess 108 to the side face of the gate electrode 112 is set larger than the distance from the source electrode 110 side end thereof to the side face of the gate electrode 112.

With this arrangement in the semiconductor device of Embodiment 4, the cap layer 107 is made close to the gate electrode 112 to reduce the source resistance and to increase the breakdown voltage between the gate electrode 112 and the drain electrode 111, thereby attaining further higher output operation.

Figure 12:
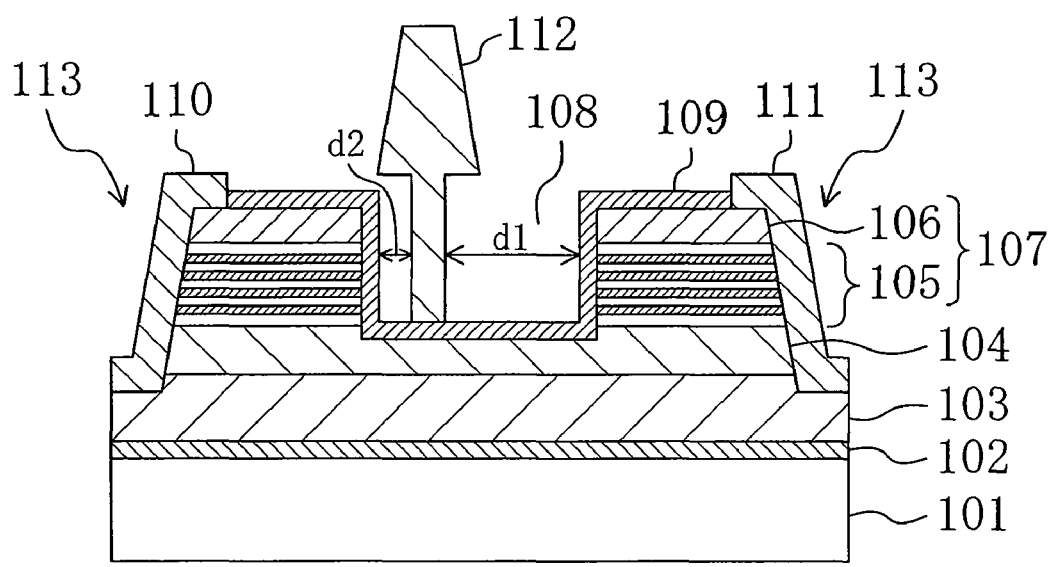
FIG. 12 is a sectional view showing a semiconductor device in accordance with one modified example of Embodiment 4 of the present invention.

Preferably, as shown in FIG. 12 as one modified example of Embodiment 4, the ohmic recess 113 extending from the n-type GaN layer 106 to the active layer 103 in a part of each ohmic electrode formation region is formed as an isolation region.

In Embodiments 1 to 4 and the modified examples thereof, a four-element mixed crystal of indium aluminum gallium nitride (InAlGaN) may be used as a material of the cap layer 107, as disclosed in Patent Document 1. Herein, the cap layer 107 made of four-element mixed crystal of InAlGaN is called a four-element cap layer. When the polarized charges of a four-element cap layer as the cap layer 107 is adjusted by appropriately controlling each component of the four elements, negative fixed charges generated at the interface between the barrier layer 104 made of AlGaN and the four-element cap layer 107 can be suppressed. As a result, the source resistance of the semiconductor device (MIS-type HFET) can be reduced.

Further, in each of the above embodiments and the modified examples thereof, the superlattice layer 105 and a four-element cap layer may be used in combination as the cap layer 107.

In addition, in each of the above embodiments and the modified examples thereof, the insulating film 109 or the lower insulating film 109A, which are made of silicon nitride, may be crystallized. The crystallized silicon nitride can be formed by, for example, MOCVD under an atmosphere of silane ($SiH_4$) and ammonia ($NH_3$) at a temperature of 900° C. and at a pressure of approximately $1.33 \times 10^4$ Pa (=100 Torr).

Embodiment 5

Embodiment 5 of the present invention will be described below with reference to the drawings.

Figure 13:
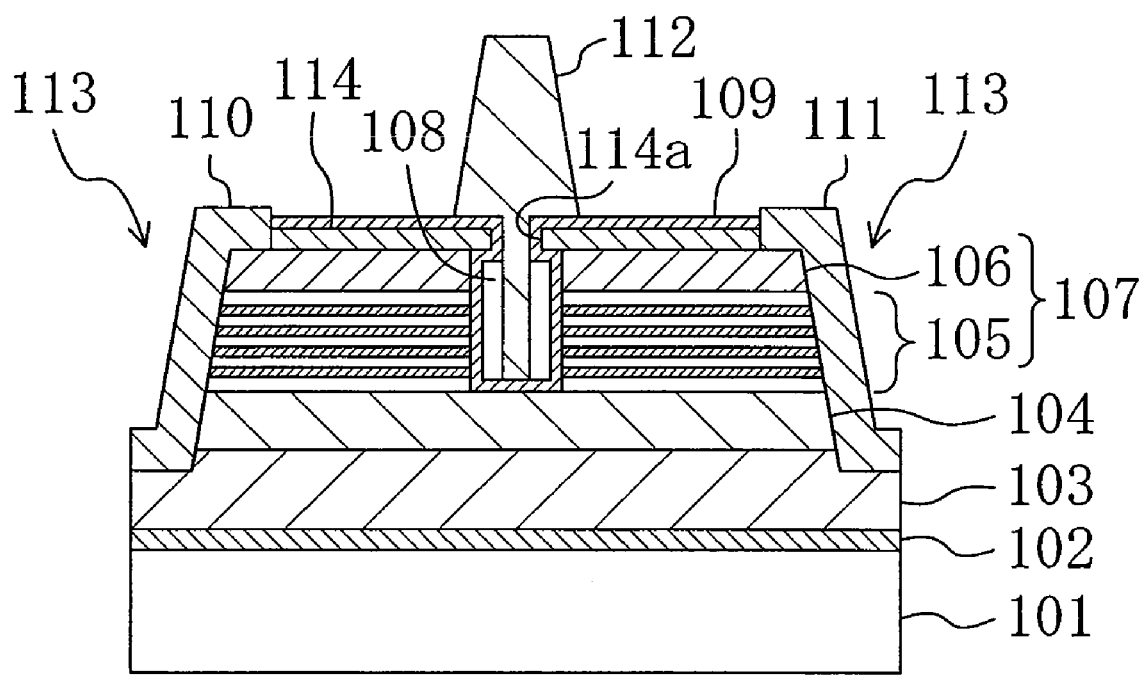
FIG. 13 is a sectional view showing a semiconductor device in accordance with Embodiment 5 of the present invention.

FIG. 13 shows a sectional structure of a MIS-type HFET as a semiconductor device in accordance with Embodiment 5 of the present invention. In FIG. 13, the same reference numerals are assigned to the same elements as those shown in FIG. 1 for omitting description thereof.

As shown in FIG. 13, in the semiconductor device of Embodiment 5, an etching mask layer 114 made of, for example, silicon oxide ($SiO_2$) is formed on the n-type GaN layer 106 and the gate electrode 112 is formed in self alignment through a slit (a first opening) 114a formed in a part of the etching mask layer 114 which is located above the gate recess (second opening) 108.

In Embodiment 5, the gate electrode 112 and the gate recess 108 are formed in self alignment, which allows the gate electrode 112 and the cap layer 107 to be close to each other free from the constraint of the mask alignment precision. Hence, the parasitic resistance between the gate electrode 112 and the ohmic electrodes of the source electrode 110 and the drain electrode 111 can be reduced to the utmost.

A method for manufacturing the thus structured semiconductor device will be described below with reference to the drawings.

FIG. 14A to FIG. 14D, FIG. 15A, and FIG. 15B are sectional views showing in sequence steps of the semiconductor device manufacturing method in accordance with Embodiment 5 of the present invention.

Figure 14A:
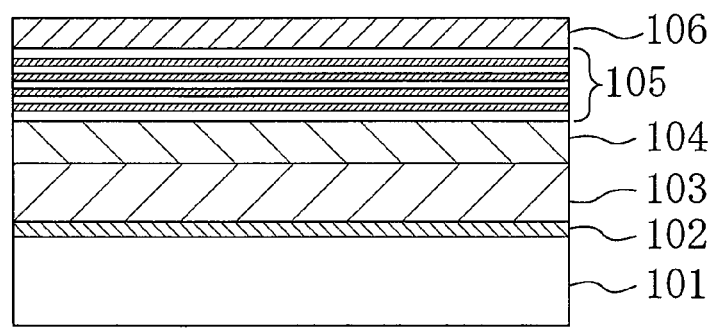
FIG. 14A to FIG. 14D are sectional views showing steps of a semiconductor device manufacturing method in accordance with Embodiment 5 of the present invention.

First, as shown in FIG. 14A, MOCVD, for example, is performed to form sequentially in this order on the substrate 101 made of sapphire by epitaxial growth the buffer layer 102, the active layer 103, the barrier layer 104, the superlattice layer 105 formed by layering an n-type AlGaN layer and an n-type GaN layer seven times, and the n-type GaN layer 106, similarly to Embodiment 1.

Figure 14B:
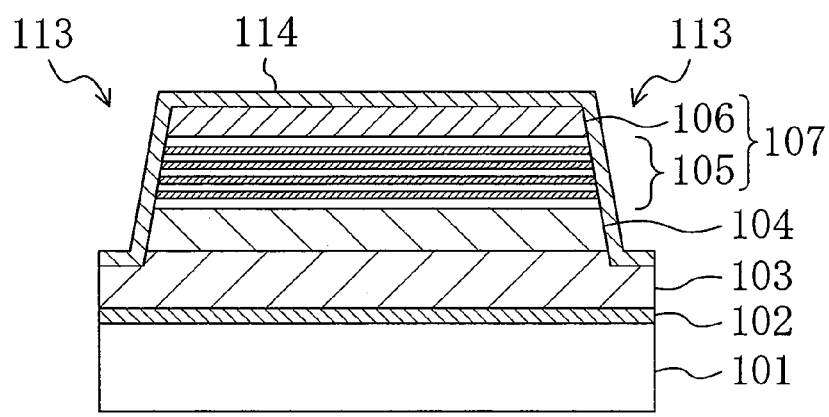

Next, as shown in FIG. 14B, lithography and dry etching using a chlorine ($Cl_2$) gas as a main component of the etching gas are performed to selectively caving respective parts of the ohmic electrode formation region of the n-type GaN layer 106, the superlattice layer 105, the barrier layer 104, and the active layer 103 for forming the ohmic recesses 113. Then, p-CVD, for example, is performed to form an etching mask layer 114 made of silicon oxide with a thickness of, for example, 100 nm on an epitaxial semiconductor layer in which the ohmic recesses 113 are formed. The ohmic recesses 113 may not necessarily be formed.

Figure 14C:
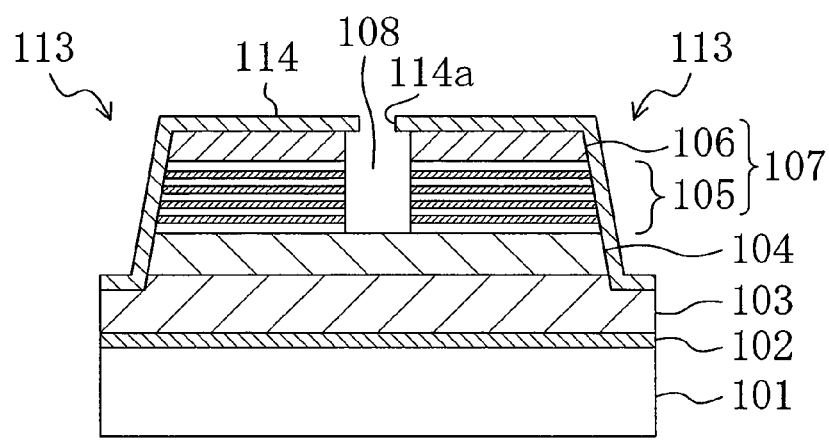

Subsequently, as shown in FIG. 14C, lithography and dry etching are performed to form the slit 114a at a part included in the gate recess formation region of the etching mask layer 114. Then, dry etching using, for example, a chlorine ($Cl_2$) gas as a main component of the etching gas and wet etching using, for example, potassium hydrate (KOH) as an etchant are performed with the use of the etching mask layer 114 in which the slit 114a is formed as a mask to cave respective parts of the n-type GaN layer 106, the superlattice layer 105, and the barrier layer 104 selectively for forming the gate recess 108 through which the barrier layer 104 is exposed.

Figure 14D:
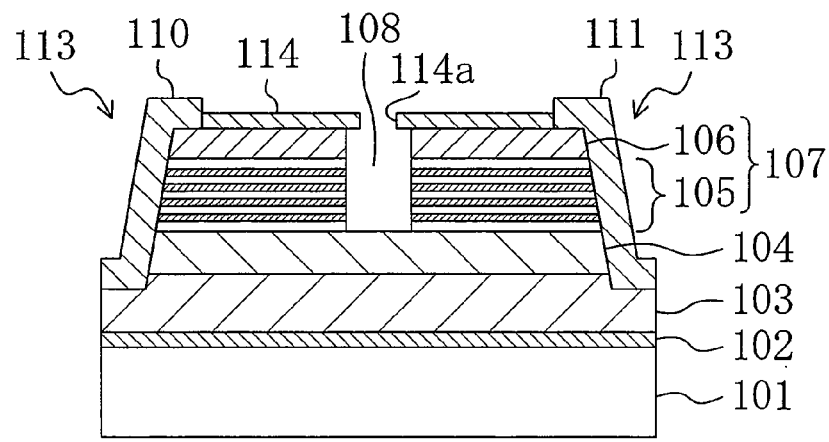

Thereafter, as shown in FIG. 14D, each upper part in the ohmic electrode formation regions of the etching mask layer 114 is removed selectively. Then, vacuum deposition or the like is performed to deposit Ti and Al over a resist mask (not shown) for exposing the ohmic electrode formation regions. Lift-off and predetermined alloying treatment are then performed to form the source electrode 110 and the drain electrode 111 as the ohmic electrodes made of Ti/Al.

Figure 15A:
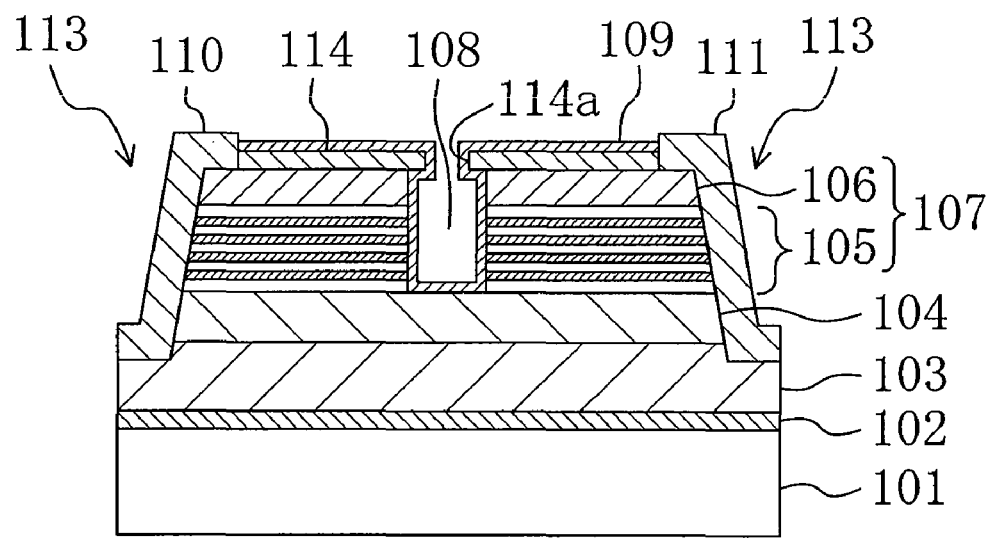
FIG. 15A and FIG. 15B are sectional views showing steps of the semiconductor device manufacturing method in accordance with Embodiment 5 of the present invention.

Next, as shown in FIG. 15A, p-CVD or the like is performed to form the insulating film (gate insulating film) 109 made of silicon nitride (SiN) with a thickness of, for example, 4 nm on the bottom and wall faces of the gate recess 108 through the slit 114a of the etching mask layer 114.

Figure 15B:
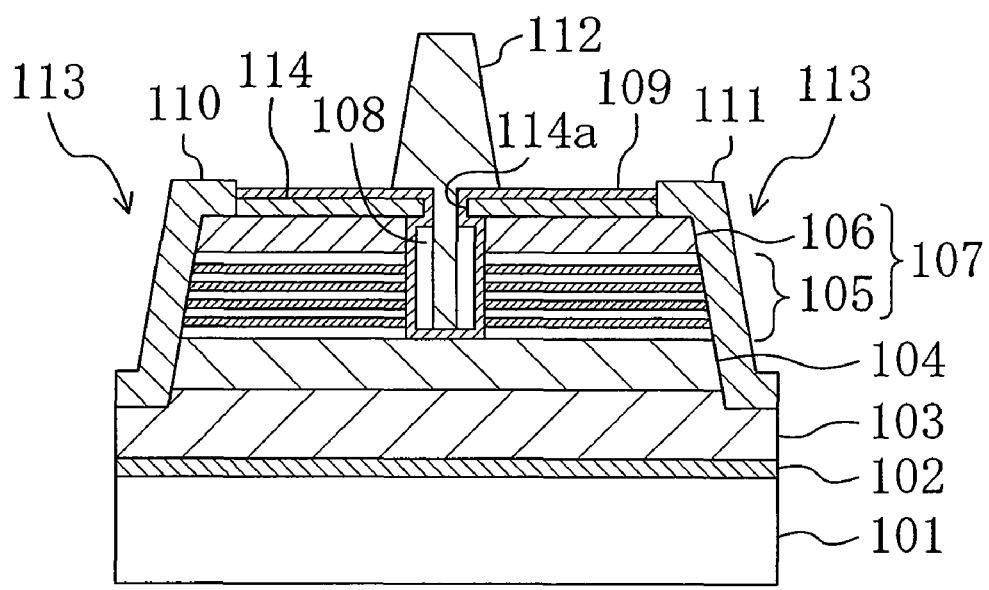
Figure 16:
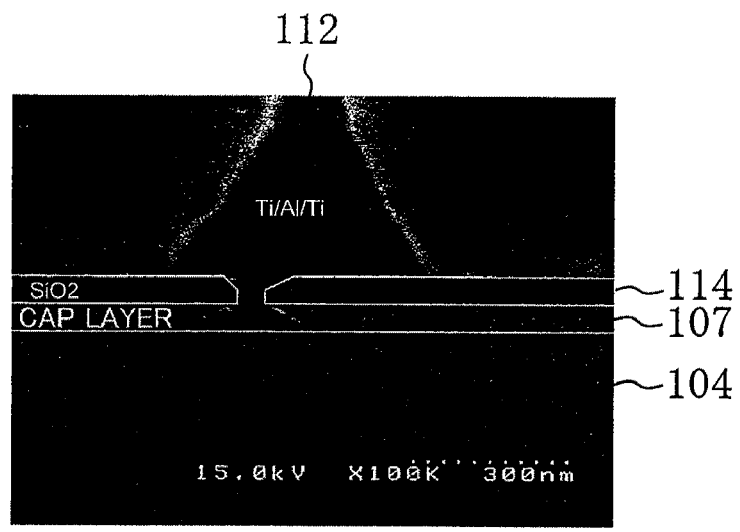
FIG. 16 is a SEM (scanning electron microscopy) photo showing a section of a gate electrode and the vicinity thereof in the semiconductor device in accordance with Embodiment 5 of the present invention.

Subsequently, as shown in FIG. 15B, lithography, vacuum deposition, and lift-off are performed to form the gate electrode 112 made of Ti/Al/Ti through the slit 114a of the etching mask layer 114. Thus, the gate electrode 112 having a T-shaped section of which lower part is thin and upper part is thick is formed in self alignment.

For reducing the parasitic capacity, it is preferable to remove respective parts of the etching mask layer 114 and the insulating film 109 which are located around the gate electrode 112 and is more preferable to remove respective parts of the etching mask layer 114 and the insulating film 109 which are located above the gate recess 108 after the step shown in FIG. 15B. Etching for removing them may be either dry etching or wet etching. In the case of dry etching, however, etching conditions must be set for reducing the etching rate of the insulting film 109 to, for example, the etching mask layer 114. While in the case of wet etching, gold (Au) coating, for example, is necessitated for preventing the gate electrode 112 from being etched.

FIG. 6 is a SEM (Scanning Electron Microscope) photo of the gate electrode 112 of the semiconductor device manufactured by the manufacturing method in accordance with Embodiment 5. As shown in FIG. 6, the distance between the gate electrode 12 and the cap layer 107 in the gate recess 108 is short, 30 nm. The insulating film 109 is too thin to appear in the photo.

The insulating film 109 may be formed by MOCVD rather than p-CVD. In so doing, it is preferable to form the insulating film 109 before the step shown in FIG. 14D, that is, before formation of the ohmic electrodes.

As described above, in Embodiment 5, the etching mask layer 114 in which the slit 114a is formed is formed on the cap layer 107 and the gate recess 108 is formed in the cap layer 107 with the use of the thus formed etching mask layer 114, so that the gate recess 108 and the gate electrode 112 can be formed in self alignment. This allows the gate electrode 112 and the cap layer 107 to be close to each other free from the mask alignment precision defined by lithography, thereby reducing the parasitic resistance between the gate electrode and the ohmic electrodes of the source electrode 110 and the drain electrode 111 to the utmost.

Figure 17:
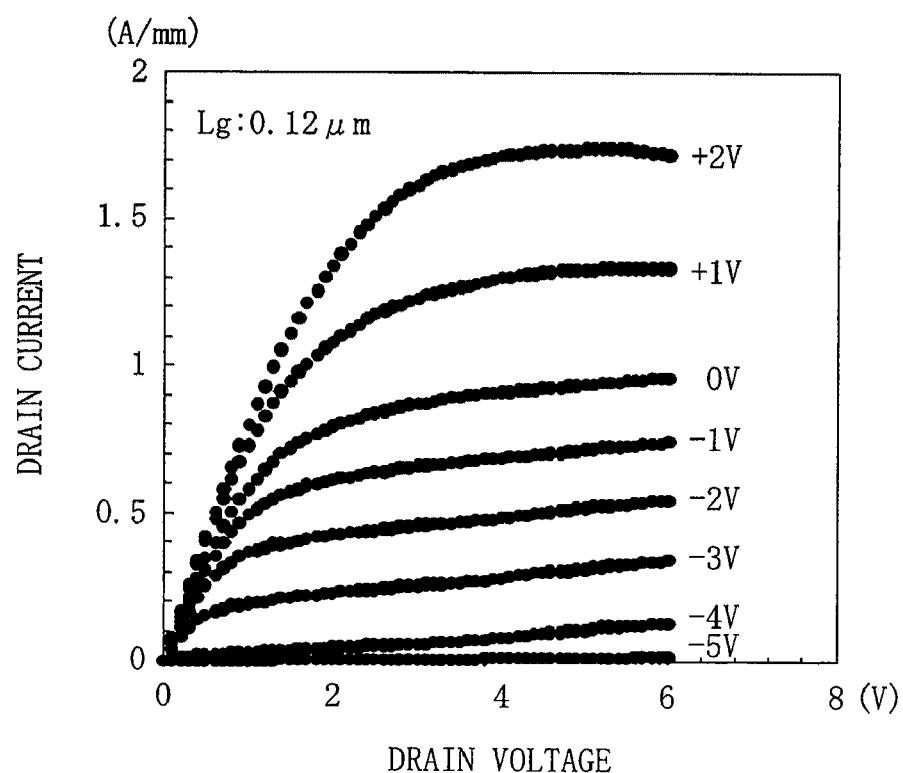
FIG. 17 is a graph showing a current-voltage (I-V) characteristic of the semiconductor device in accordance with Embodiment 5 of the present invention.
Figure 18:
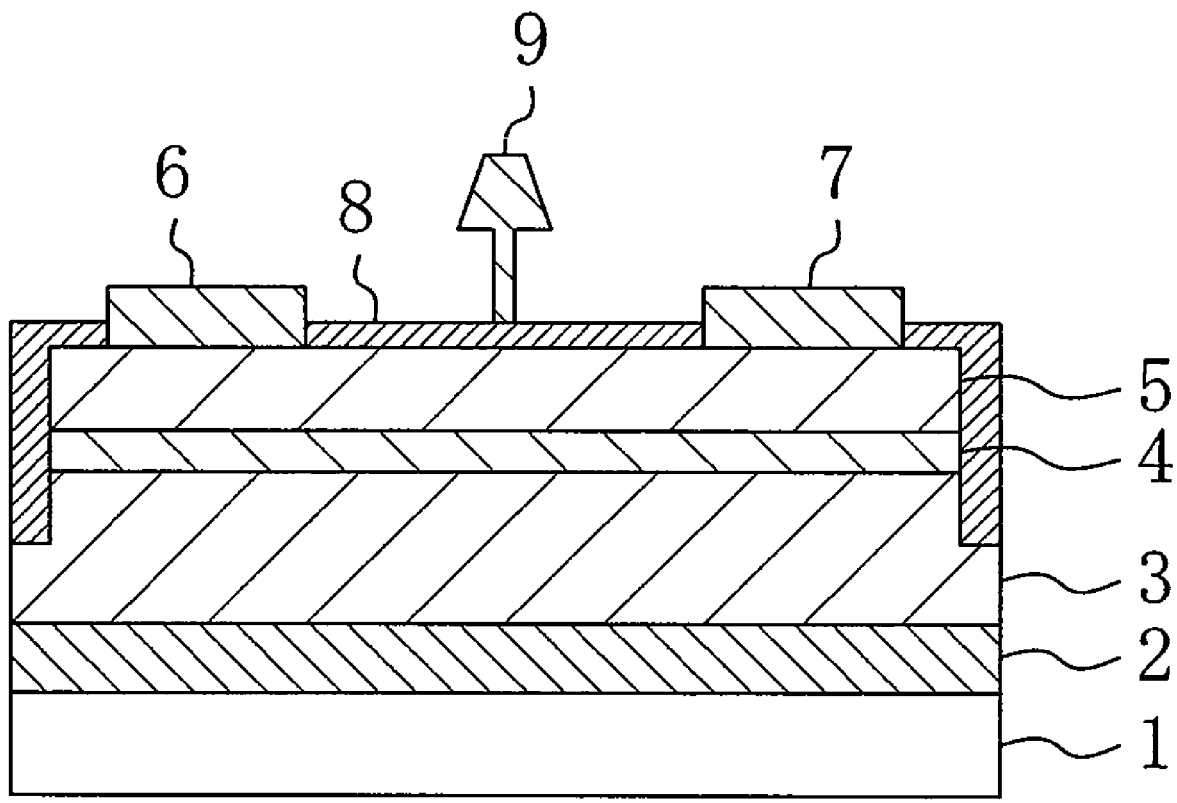
FIG. 18 is a sectional view showing a conventional MIS type HFET.

FIG. 17 shows the relationship between the drain current and the drain voltage of the semiconductor device of Embodiment 5. Herein, the gate length $L_g$ is set at 0.12 μm. As can be understood from FIG. 17, the transistor operation and the pinch-off characteristics are favorable and the maximum drain current reaches 1.75 A/mm, resulting in attainment of a maximum transconductance of 440 mS/mm.

The material of the etching mask layer 114 is not limited to silicon oxide and may be any material resistant to dry etching and wet etching.

As described so far, the semiconductor device and the method for manufacturing it in accordance with the present invention can reduce the source resistance while enhancing the transconductance of a transistor and are therefore useful for a high-frequency gallium nitride-based semiconductor device including a MIS-type gate electrode and a method for manufacturing it.

What is claimed is:

1. A semiconductor device, comprising:
a first semiconductor layer made of a first group III nitride semiconductor;
a cap layer which is formed on the first semiconductor layer, is made of a second group III nitride semiconductor, and has an opening exposing the first semiconductor layer;
a source electrode and a drain electrode which are formed on the cap layer so as to oppose to each other with the opening interposed;
an insulating film formed on at least a part of the first semiconductor layer which is exposed through the opening; and
a gate electrode formed on a bottom face of the opening with the insulating film interposed, wherein:
the insulating film has a region which is in direct contact with a bottom part of the gate electrode, and
the region has a concave portion caved to the extent that the first semiconductor layer is not exposed.

2. The semiconductor device of claim 1,
wherein the insulating film is formed also on a wall face of the cap layer which is exposed through the opening.

3. The semiconductor layer of claim 1,
wherein the cap layer has a layered structure formed by layering a third, semiconductor layer made of a third group III nitride semiconductor and a fourth semiconductor layer made of a fourth group III nitride semiconductor having a bandgap wider than that of the third group III nitride semiconductor.

4. The semiconductor device of claim 3,
wherein the third semiconductor layer is made of gallium nitride while the fourth semiconductor layer is made of aluminum gallium nitride.

5. The semiconductor device of claim 1,
wherein the cap layer includes a semiconductor layer made of indium aluminum gallium nitride.

6. The semiconductor device of claim 1,
wherein the first semiconductor layer includes an $Al_xGa_{1-x}N$ layer and a GaN layer in contact with the $Al_xGa_{1-x}N$ layer, wherein $0<x\leq1$.

7. The semiconductor device of claim 1,
wherein the insulating film is made of silicon nitride.

8. The semiconductor device of claim 1,
wherein the insulating film is made of crystallized silicon nitride.

9. The semiconductor device of claim 1,
wherein the gate electrode includes an upper part and a lower part which is in contact with the insulating film and which is formed thinner than the upper part.

10. The semiconductor layer of claim 1,
wherein the insulating film is a layered film of two or more layers.

11. A semiconductor device, comprising:
a first semiconductor layer made of a first group III nitride semiconductor;
a cap layer which is formed on the first semiconductor layer, is made of a second group III nitride semiconductor, and has an opening exposing the first semiconductor layer;
a source electrode and a drain electrode which are formed on the cap layer so as to oppose to each other with the opening interposed;
an insulating film formed on at least a part of the first semiconductor layer which is exposed through the opening; and
a gate electrode formed on a bottom face of the opening with the insulating film interposed, wherein:
the insulating film is a layered film including two or more layers, the layered film includes a lower layer film and an upper layer film,
the upper layer film has a region which is in direct contact with a bottom part of the gate electrode, and
the region has a concave portion which is caved.

12. The semiconductor device of claim 11,
wherein the layered film includes a lower layer film and an upper layer film having a dielectric constant lower than that of the lower layer film.

13. The semiconductor device of claim 11,
wherein the lower layer film is made of silicon nitride while the upper layer film is made of silicon oxide.

14. The semiconductor device of claim 1,
wherein a recessed part exposing the first semiconductor layer is formed in a region of the cap layer which is located outside the opening.

15. The semiconductor device of claim 1,
wherein a distance from a drain electrode side end of the opening to the gate electrode is larger than a distance from a source electrode side end of the opening to the gate electrode.

16. The semiconductor device of claim 1,
wherein a distance from a wall face of the opening to a side face of a lower end part of the gate electrode is 100 nm or less.

17. A semiconductor device, comprising:
a first semiconductor layer made of a first group III nitride semiconductor;
a cap layer which is formed on the first semiconductor layer, is made of a second group III nitride semiconductor, and has an opening exposing the first semiconductor layer;
a source electrode and a drain electrode which are formed on the cap layer so as to oppose to each other with the opening interposed;
an insulating film formed on at least a part of the first semiconductor layer which is exposed through the opening; and
a gate electrode formed on a bottom face of the opening with the insulating film interposed,
wherein the gate electrode is formed in self alignment through a slit which is located above the opening.

18. The semiconductor device of claim 17,
wherein a distance from a wall face of the opening to a side face of a lower end part of the gate electrode is 100 nm or less.

19. The semiconductor device of claim 17,
wherein the cap layer has a layered structure obtained by layering a third semiconductor layer made of a third group III nitride semiconductor and a fourth semiconductor layer made of a fourth group III nitride semiconductor having a bandgap wider than that of the third group III nitride semiconductor.

20. The semiconductor device of claim 17,
wherein the gate electrode includes an upper part and a lower part which is in contact with the insulating film and is formed thinner than the upper part.

21. A semiconductor device, comprising:
a first semiconductor layer made of a first group III nitride semiconductor;
a cap layer which is formed on the first semiconductor layer, is made of a second group III nitride semiconductor, and has an opening exposing the first semiconductor layer;
an etching mask layer formed on the cap layer, the etching mask layer having a slit which is located above the opening;
an insulating film formed on at least a part of the first semiconductor layer which is exposed through the opening; and
a gate electrode formed on a bottom face of the opening with the insulating film interposed,
wherein the opening has an opening width larger than the width of the slit,
in the slit, the gate electrode is formed on the etching mask layer with the insulating film interposed, and
in the opening, a cavity is disposed between the gate electrode and the cap layer.

22. The semiconductor device of claim 21,
wherein a distance from a wall face of the opening to a side face of a lower end part of the gate electrode is 100 nm or less.

23. The semiconductor device of claim 21,
wherein the cap layer has a layered structure obtained by layering a third semiconductor layer made of a third group III nitride semiconductor and a fourth semiconductor layer made of a fourth group III nitride semiconductor having a bandgap wider than that of the third group III nitride semiconductor.

24. The semiconductor device of claim 21,
wherein the gate electrode includes an upper part and a lower part which is in contact with the insulating film and which is formed thinner than the upper part.

25. The semiconductor device of claim 21,
wherein in the slit, the gate electrode is in direct contact with the insulating film.

* * * * *